(12) United States Patent
Nakayama

(10) Patent No.: US 10,121,927 B2
(45) Date of Patent: Nov. 6, 2018

(54) SEMICONDUCTOR DEVICE AND METHOD OF MANUFACTURING THE SAME

(71) Applicant: Renesas Electronics Corporation, Koutou-ku, Tokyo (JP)

(72) Inventor: Tomoo Nakayama, Ibaraki (JP)

(73) Assignee: Renesas Electronics Corporation, Tokyo ( * ) Notice: Subject to any disclaimer, the term of this patent is extended or adjusted under 35 U.S.C. 154(b) by 16 days.

(21) Appl. No.: 15/656,212

(22) Filed: Jul. 21, 2017

(65) Prior Publication Data

US 2018/0090636 A1 Mar. 29, 2018

(30) Foreign Application Priority Data

Sep. 28, 2016 (JP) ................................ 2016-189716

(51) Int. Cl.
| | |
|---|---|
| *H01L 31/105* | (2006.01) |
| *H01L 31/02* | (2006.01) |
| *H01L 31/0216* | (2014.01) |
| *H01L 31/028* | (2006.01) |
| *H01L 31/18* | (2006.01) |

(52) U.S. Cl.
CPC .... *H01L 31/1055* (2013.01); *H01L 31/02005* (2013.01); *H01L 31/028* (2013.01); *H01L 31/02161* (2013.01); *H01L 31/1804* (2013.01)

(58) Field of Classification Search
None
See application file for complete search history.

(56) References Cited

U.S. PATENT DOCUMENTS

| 8,269,303 | B2 | 9/2012 | Fujikata et al. |
| 2007/0104441 | A1* | 5/2007 | Ahn ................... G02B 6/12004 385/129 |
| 2007/0116398 | A1* | 5/2007 | Pan ........................ G02F 1/025 385/2 |
| 2009/0101909 | A1* | 4/2009 | Chen ............... H01L 31/035281 257/65 |
| 2010/0029033 | A1* | 2/2010 | Carothers ............. H01L 31/105 438/69 |

(Continued)

FOREIGN PATENT DOCUMENTS

WO WO 2009/110632 A1 9/2009

*Primary Examiner* — Whitney T Moore
*Assistant Examiner* — Herve Assouman
(74) *Attorney, Agent, or Firm* — Shapiro, Gabor and Rosenberger, PLLC

(57) ABSTRACT

A provided semiconductor device includes a Ge photodiode having proper diode characteristics. A groove is provided on a germanium growth protective film, a p-type silicon layer, and a first insulating film from the top surface of the germanium growth protective film without reaching the major surface of a semiconductor substrate. An i-type germanium layer and an n-type germanium layer are embedded in the groove with a seed layer interposed between the layers and the groove, the seed layer being made of amorphous silicon, polysilicon, or silicon germanium. The i-type germanium layer and the n-type germanium layer do not protrude from the top surface of the germanium growth protective film, thereby forming a flat second insulating film having a substantially even thickness on the n-type germanium layer and the germanium growth protective film.

15 Claims, 10 Drawing Sheets

(56) References Cited

U.S. PATENT DOCUMENTS

2011/0012221 A1\* 1/2011 Fujikata ............ G02B 6/12004
 257/458
2012/0025195 A1\* 2/2012 McComber ............ C23C 16/04
 257/65

\* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2016-189716 filed on Sep. 28, 2016 including the specification, drawings and abstract is incorporated herein by reference in its entirety.

CROSS-REFERENCE TO RELATED APPLICATIONS

The present invention relates to a semiconductor device and a method of manufacturing the same and can be properly used for manufacturing a semiconductor device including, for example, a germanium photodiode (Hereinafter will be referred to as a Ge photodiode).

BACKGROUND

WO09/110632 describes a vertical pin-SiGe photodiode in which a p-type or n-type doped layer is formed under a groove, i-SiGe is formed into a rectangle or an inverted taper on the doped layer with an i-Si layer and a Si—Ge buffer layer stacked on the bottom and side walls of the doped layer.

SUMMARY

A Ge photodiode has a structure including a semiconductor substrate, a lower clad layer formed on the major surface of the semiconductor substrate, a light absorbing layer that is formed on the lower clad layer and is made of, for example, germanium, and an upper clad layer that is formed over the light absorbing layer. When a coupling hole is formed on the upper clad layer, unfortunately, a step on the light absorbing layer may cause a defective opening or an unwanted cut of the upper clad layer so as to preclude the provision of proper diode characteristics in the Ge photodiode.

Other problems and new characteristics will be clarified by a description of the present specification and the accompanying drawings.

A semiconductor device according to an embodiment includes a semiconductor substrate, a first insulating film formed on the major surface of the semiconductor substrate, a silicon layer formed on the first insulating film, and a protective film formed on the silicon layer. Furthermore, the semiconductor device includes a groove formed on the protective film, the silicon layer, and the first insulating film from the top surface of the protective film without reaching the major surface of the semiconductor substrate, a seed layer is formed on the bottom and sides of the groove, a germanium layer embedded in the groove with the seed layer interposed between the germanium layer and the groove, and a second insulating film formed on the germanium layer and the protective film.

A method of manufacturing a semiconductor device according to an embodiment includes the steps of: preparing a SOI substrate including a semiconductor substrate, a first insulating film formed on the major surface of the semiconductor substrate, and a silicon layer formed on the first insulating film; forming a protective film on the silicon layer; and processing the protective film, the silicon layer, and the first insulating film in sequence so as to form a groove from the top surface of the protective film without reaching the major surface of the semiconductor substrate. The method further includes the steps of: forming a seed layer on the protective film as well as the bottom and sides of the groove; removing the seed layer on the protective film so as to leave the seed layer on the bottom and sides of the groove; forming a germanium layer in the groove by selective epitaxial growth; and forming a second insulating film on the germanium layer and the protective film.

According to the embodiment, the semiconductor device can be provided with a Ge photodiode having proper diode characteristics.

DETAILED DESCRIPTION

Figure 1:
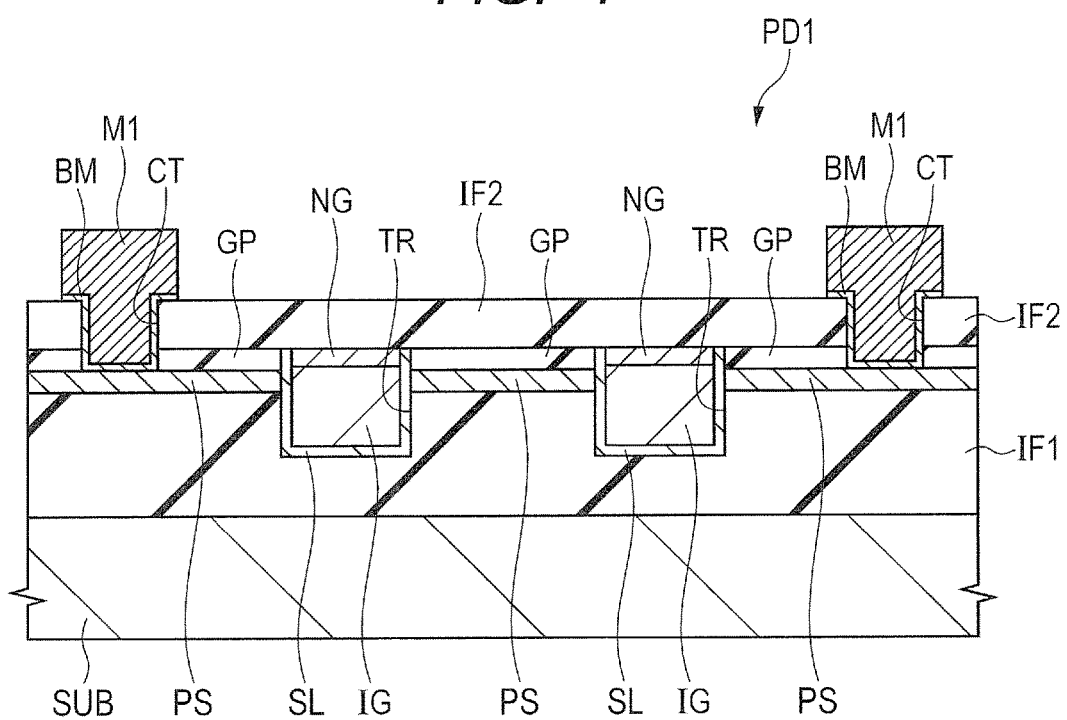
FIG. 1 is a cross-sectional view showing the principal part of a Ge photodiode according to a first embodiment.

In the following embodiments, for the convenience of explanation, a plurality of sections or the embodiments will be separately described. The sections or embodiments are relevant to one another unless otherwise specified. One of the sections or embodiments is, for example, a modification, a detail, and a supplementary explanation of some or all of the other sections or embodiments.

In the following embodiments, the number of elements (including a number, a numeric value, an amount, and a range) is not limited to a specific number unless otherwise specified or clearly limited to the specific number in theory. Thus, the number of elements may be larger or smaller than the specific number.

Obviously, the constituent elements (including element steps) of the following embodiments are not always necessary unless otherwise specified or clearly required in theory.

Furthermore, "comprised of A", "configured with A", "having A", and "including A" do not exclude other elements unless otherwise specified. Similarly, the shapes and positional relationships of constituent elements substantially include the close or similar shapes of the constituent elements unless otherwise specified or clearly excluded in theory. This also holds for the numeric value and the range.

In all the drawings of the following embodiments, the constituent elements having the same functions are fundamentally indicated by the same reference numerals and the repeated explanation thereof is omitted. Moreover, parts in the drawings may not be sized for actual devices. For simplification, a specific part may be illustrated in a relatively large size.

The embodiments will be specifically described below in accordance with the accompanying drawings.

Detailed Explanation of the Problems of the Related Art

A recent technique of so-called silicon photonics has been actively developed in which an optical-signal transmission line made of silicon is produced, an optical circuit including the optical-signal transmission line is used as a platform, and an optical communication module is obtained by integrating various optical devices and electronic devices.

For optical circuits basically configured with optical waveguides formed on a silicon substrate, silicon waveguides including silicon cores are mainly used. Silicon is a material widely used for electronic circuits. Using silicon waveguides allows the fabrication of an optical circuit and an electronic circuit on the same substrate.

As a method of converting an optical signal to an electric signal, the practical use of a Ge photodiode has been recently examined in which germanium having a smaller band gap than silicon serves as a light absorbing layer. This is because germanium having a smaller band gap than silicon is preferably used to detect far-red light having a wavelength up to about 1.6 μm within a communication wavelength range on an electronic circuit and germanium having high compatibility with silicon can be formed into a monolithic pattern on silicon waveguides.

Thus, the present inventors have examined the structures of Ge photodiodes and methods of manufacturing the same in various ways.

Figure 17:
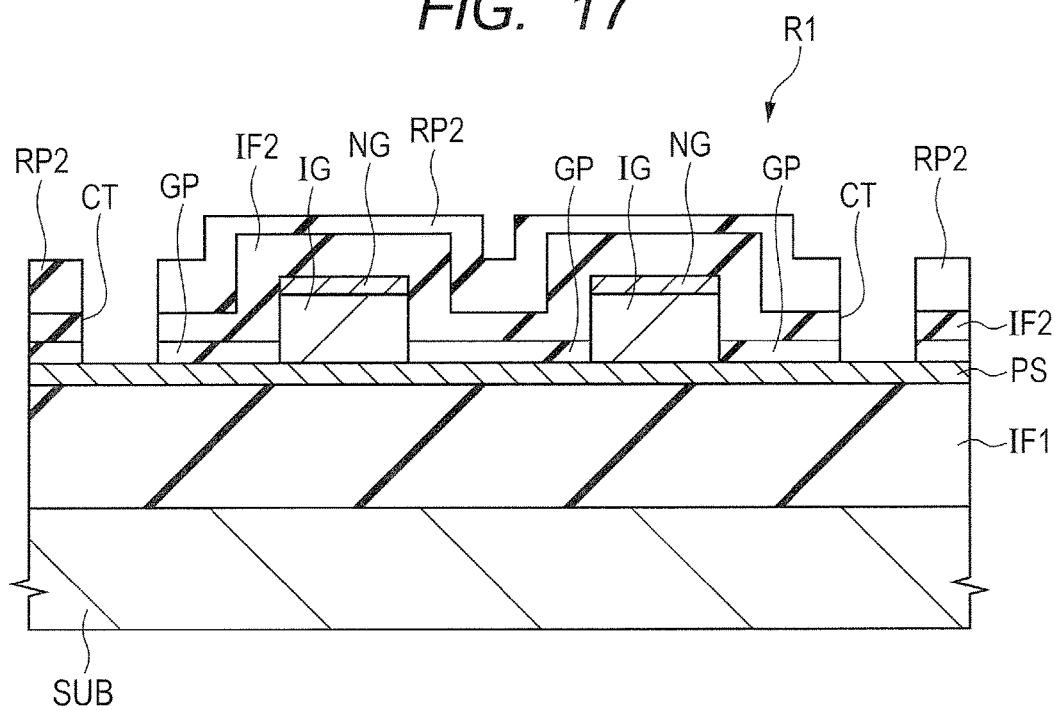
FIG. 17 is a cross-sectional view showing the principal part of a Ge photodiode according to a first example, which was compared by the present inventors prior to the present invention.

FIG. 17 is a cross-sectional view showing the principal part of a Ge photodiode having a pin structure according to a first example, which was compared by the present inventors prior to the present invention.

As shown in FIG. 17, a Ge photodiode R1 is formed on a first insulating film IF1 formed on the major surface of a semiconductor substrate SUB. The Ge photodiode R1 includes a p-type semiconductor silicon layer PS, a germanium layer IG of an intrinsic semiconductor, and an n-type semiconductor germanium layer NG, which are sequentially stacked on the first insulating film IF1. In the following explanation, the p-type semiconductor silicon layer PS will be referred to as a p-type silicon layer PS, the germanium layer IG of an intrinsic semiconductor will be referred to as an i-type germanium layer IG, and the n-type semiconductor germanium layer NG will be referred to as an n-type germanium layer NG. Moreover, the p-type silicon layer PS, the i-type germanium layer IG, and the n-type germanium layer NG are covered with a second insulating film IF2 and so on.

In the Ge photodiode R1, however, the i-type germanium layer IG and the n-type germanium layer NG are stacked with a large thickness of, for example, at least 1 μm. This may cause a fault when a coupling hole CT is formed on the second insulating film IF2 covering a step on the stacked layers such that the coupling hole CT reaches the p-type silicon layer PS or the n-type germanium layer NG.

For example, when the second insulating film IF2 is processed, a resist pattern RP2 used as a mask may vary in thickness so as to have a smaller thickness above the n-type germanium layer NG than that above the p-type silicon layer PS. Using the resist pattern RP2 that varies in thickness may cause incorrect focus in lithography or insufficiently leave the resist pattern RP2 above the n-type germanium layer NG, disadvantageously leading to a defective opening of the coupling hole CT or a cut of the second insulating film IF2 on the n-type germanium layer NG.

The second insulating film IF2 may have a larger thickness above the n-type germanium layer NG than that above the p-type silicon layer PS. When the coupling hole CT is formed on the second insulating film IF2, which varies in thickness, simultaneously above the p-type silicon layer PS and the n-type germanium layer NG, an over-etching amount may vary so as to cause a defective opening of the coupling hole CT. Thus, desired diode characteristics cannot be obtained in the Ge photodiode R1.

Figure 18:
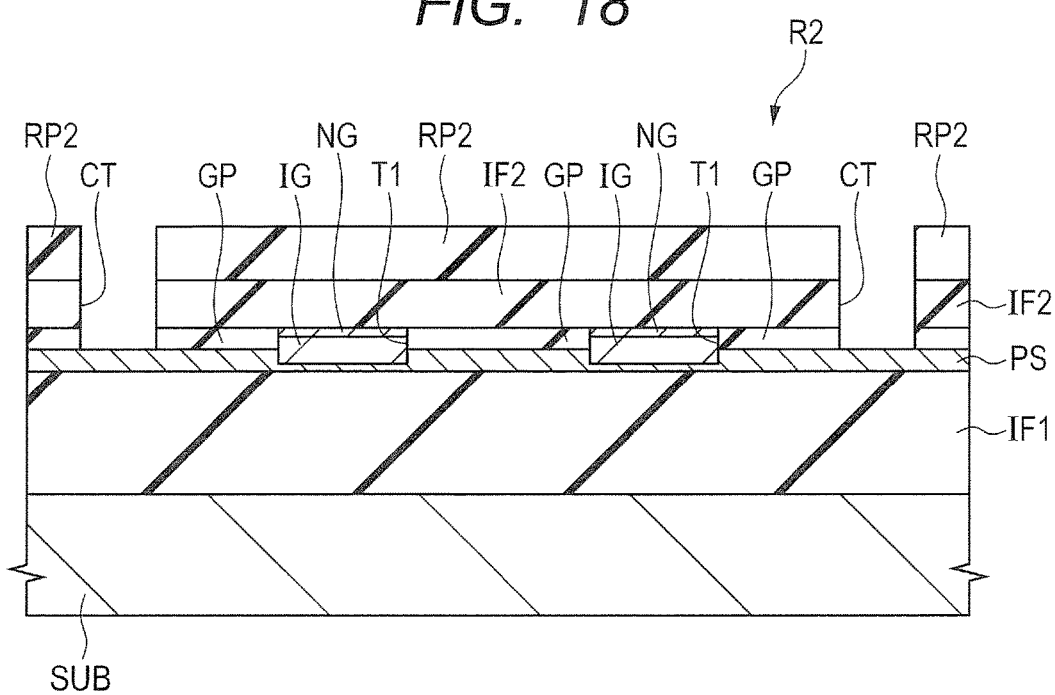
FIG. 18 is a cross-sectional view showing the principal part of a Ge photodiode according to a second example, which was compared by the present inventors prior to the present invention.

FIG. 18 is a cross-sectional view showing the principal part of a Ge photodiode having a pin structure according to a second example, which was compared by the present inventors prior to the present invention.

As shown in FIG. 18, a first insulating film IF1, a p-type silicon layer PS, and a germanium growth protective film GP are sequentially stacked on the major surface of a semiconductor substrate SUB. In this laminated structure, a groove T1 is formed on the germanium growth protective film GP and the p-type silicon layer PS from the top surface of the germanium growth protective film GP without reaching the first insulating film IF1. An i-type germanium layer IG is embedded in the groove T1 and an n-type germanium layer NG is formed on the i-type germanium layer IG.

Specifically, a Ge photodiode R2 includes the p-type silicon layer PS, the i-type germanium layer IG embedded in the groove T1 formed on the germanium growth protective film GP and the p-type silicon layer PS, and the n-type germanium layer NG formed on the i-type germanium layer IG. Thus, unlike in the Ge photodiode R1, a step does not cause a fault.

In the Ge photodiode R2, however, the p-type silicon layer PS has a small thickness of about 200 nm and thus the i-type germanium layer IG also has a small thickness, disadvantageously precluding the provision of proper photodiode characteristics.

First Embodiment

<The Structure of a Semiconductor Device>

Referring to FIG. 1, the structure of a Ge photodiode according to a first embodiment will be described below. FIG. 1 is a cross-sectional view showing the principal part of the Ge photodiode according to the first embodiment.

A Ge photodiode PD1 is a pin-type photodiode where an i-type germanium layer IG of an intrinsic semiconductor serves as a light absorbing layer.

A first insulating film (may be called a BOX layer, a clad layer, or a lower clad layer) IF1, a p-type silicon layer PS of a p-type semiconductor, and a germanium growth protective film GP are sequentially stacked on the major surface of a semiconductor substrate SUB. The germanium growth protective film GP is made of, for example, silicon oxide. Moreover, a groove TR is formed on the germanium growth protective film GP, the p-type silicon layer PS, and the first insulating film IF1 of the laminated structure from the top surface of the germanium growth protective film GP without reaching the major surface of the semiconductor substrate SUB. The groove TR is vertically extended in FIG. 1.

A seed layer SL for germanium growth is formed on the inner wall (the bottom and sides) of the groove TR in which the i-type germanium layer IG is embedded with the seed layer SL interposed between the i-type germanium layer IG and the groove TR. Furthermore, an n-type germanium layer NG of an n-type semiconductor is provided on the i-type germanium layer IG. The seed layer SL is made of, for example, amorphous silicon, polysilicon, or silicon germanium.

In other words, the Ge photodiode PD1 has a pin structure including the p-type silicon layer PS, the i-type germanium layer IG, and the n-type germanium layer NG. The n-type germanium layer NG may be replaced with an n-type silicon germanium layer or an n-type silicon layer.

Moreover, a second insulating film (a clad layer or an upper clad layer) IF2 is formed over the Ge photodiode PD1. A wire M1 of the first layer is electrically coupled to the p-type silicon layer PS through a coupling hole CT formed on the second insulating film IF2 and the germanium growth protective film GP. Moreover, the wire M1 of the first layer is electrically coupled (not shown) to the n-type germanium layer NG through the coupling hole CT formed on the second insulating film IF2. The wire M1 of the first layer is made of, for example, aluminum or copper. A barrier metal film BM is formed between the wire M1 of the first layer and the coupling hole CT.

The configuration of the Ge photodiode PD1 will be specifically described below.

The first insulating film IF1 is formed on the major surface of the semiconductor substrate SUB made of single crystal silicon. The first insulating film IF1 is made of, for example, silicon oxide and has a thickness of, for example, at least 1 µm, preferably about 1 µm to 3 µm. The first insulating film IF1 acts as a lower clad layer.

The p-type silicon layer PS made of silicon doped with an p-type impurity, e.g., boron is formed on the first insulating film IF1. It is assumed that the thickness of the p-type silicon layer PS properly ranges from, for example, 100 µm to 300 nm (not exclusive depending on other conditions) and has an optimal range with a central value of 200 nm.

The germanium growth protective film GP is formed on the p-type silicon layer PS. The germanium growth protective film GP is made of, for example, silicon oxide. It is assumed that the thickness of the germanium growth protective film GP properly ranges from, for example, 50 nm to 200 nm (not exclusive depending on other conditions) and has an optimal range with a central value of 100 nm.

The groove TR is formed on the germanium growth protective film GP, the p-type silicon layer PS, and the first insulating film IF1 of the laminated structure from the top surface of the germanium growth protective film GP without reaching the major surface of the semiconductor substrate SUB. For example, the groove TR is at least 1 µm in depth and is about 30 µm to 50 µm in width (laterally in FIG. 1).

The seed layer SL for germanium growth is formed on the inner wall (the bottom and sides) of the groove TR. The seed layer SL is made of, for example, amorphous silicon, polysilicon, or silicon germanium and has a thickness of, for example, about 10 nm.

In the groove TR, the i-type germanium layer IG is embedded with the seed layer SL interposed between the i-type germanium layer IG and the groove TR. The i-type germanium layer IG is at least 1 µm in thickness, achieving proper photodiode characteristics. The n-type germanium layer NG doped with an n-type impurity is formed on the i-type germanium layer IG. The n-type germanium layer NG may be replaced with an n-type silicon germanium layer or an n-type silicon layer.

Specifically, the Ge photodiode PD1 includes the i-type germanium layer IG provided in the groove TR, the n-type germanium layer NG on the i-type germanium layer IG in the groove TR, and the p-type silicon layer PS exposed partially on both sides of the groove TR (laterally both sides in FIG. 1).

In this configuration, the top surface of the n-type germanium layer NG does not protrude from the top surface of the germanium growth protective film GP, so that the top surface of the n-type germanium layer NG is substantially as high as the top surface of the germanium growth protective film GP.

The second insulating film IF2 is formed on the n-type germanium layer NG, which is provided in the groove TR, and the germanium growth protective film GP. For example, the second insulating film IF2 is made of silicon oxide and has a thickness of about 0.5 µm to 2 µm. Since the top surface of the n-type germanium layer NG is substantially as high as the top surface of the germanium growth protective film GP, the second insulating film IF2 is flat with a substantially even thickness.

The coupling hole CT that reaches the p-type silicon layer PS is formed on the second insulating film IF2 and the germanium growth protective film GP on the p-type silicon layer PS. For example, the coupling hole CT is about 1 µm to 2 µm in width. Moreover, the coupling hole CT (not shown) that reaches the n-type germanium layer NG is formed on the second insulating film IF2 on the n-type germanium layer NG.

The barrier metal film BM is formed on the inner wall (the bottom and sides) of the coupling hole CT. The barrier metal film BM includes, for example, a titanium film, a tantalum film, a titanium nitride film, or a tantalum nitride film. Alternatively, the barrier metal film BM includes, for example, a Ti/Ta laminated film with a titanium film serving as a lower layer and a tantalum film serving as an upper layer, a Ta/Ti laminated film with a tantalum film serving as a lower layer and a titanium film serving as an upper layer, a Ti/TiN laminated film with a titanium film serving as a lower layer and a titanium nitride film serving as an upper layer, or a Ta/TaN laminated film with a tantalum film serving as a lower layer and a tantalum nitride film serving as an upper layer. The barrier metal film BM has a thickness of, for example, about 50 nm to 100 nm. The barrier metal film BM is provided to prevent diffusion of metals (e.g., aluminum or copper) of conductive materials constituting the wire M1 of the first layer.

The wire M1 of the first layer is embedded in the coupling hole CT with the barrier metal film BM interposed between the wire M1 and the coupling hole CT. The wire M1 of the first layer is electrically coupled to the p-type silicon layer PS or the n-type germanium layer NG. Moreover, the wire M1 of the first layer is made of, for example, aluminum or copper.

As described above, in the Ge photodiode PD1, the i-type germanium IG and the n-type germanium layer NG are embedded in the groove TR having a depth of at least 0.1 μm on the first insulating film IF1, the p-type silicon layer PS, and the germanium growth protective film GP such that the n-type germanium layer NG and the i-type germanium layer IG do not protrude from the top surface of the germanium growth protective film GP.

Thus, the i-type germanium layer IG can have a thickness of at least 1 μm regardless of the thickness of the p-type silicon layer PS, achieving proper photodiode characteristics in the Ge photodiode PD1.

<The Structure of a Semiconductor Device Including an Optical Device>

Figure 2:
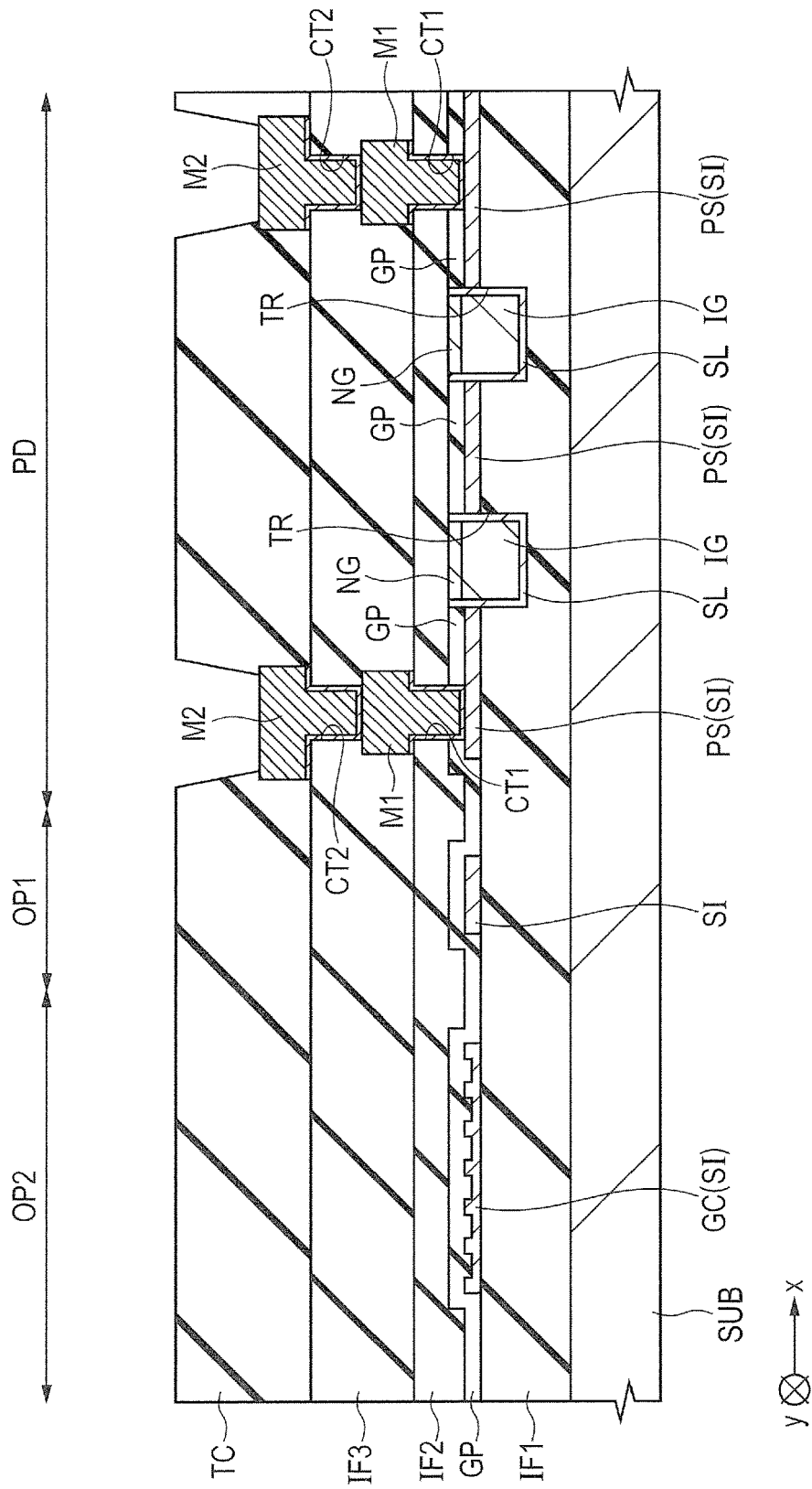
FIG. 2 is a cross-sectional view showing the principal part of a semiconductor device including a plurality of optical devices according to the first embodiment.

Referring to FIG. 2, the structure of a semiconductor device including an optical device will be described below according to the first embodiment. FIG. 2 is a cross-sectional view showing the principal part of the semiconductor device including the optical device according to the first embodiment. FIG. 2 shows a Ge photodiode PD and optical signal transmission lines (a first optical waveguide OP1 and a second optical waveguide OP2).

The Ge photodiode PD is similar to the Ge photodiode PD1 and thus the detailed explanation of the structure is omitted. In FIG. 2, the first optical waveguide OP1 and the second optical waveguide OP2 having different shapes are illustrated as optical signal transmission lines (or optical signal lines) having various structures.

The first optical waveguide OP1 and the second optical waveguide OP2 each include a silicon layer SI that is formed on the major surface of a semiconductor substrate SUB with a first insulating layer IF1 interposed between the silicon layer SI and the semiconductor substrate SUB.

The first optical waveguide OP1 vertically extends in FIG. 2 (y direction in FIG. 2). Thus, light guided into the first optical waveguide OP1 vertically travels in FIG. 2. The first optical waveguide OP1 is rectangular in cross section orthogonal to the horizontal direction of FIG. 2. The height of the first optical waveguide OP1 is, for example, about 100 nm to 300 nm, preferably about 200 nm. The width of the first optical waveguide OP1 is, for example, about 300 nm to 500 nm.

The second optical waveguide OP2 laterally extends in FIG. 2 (x direction in FIG. 2). Thus, light guided into the second optical waveguide OP2 laterally travels in FIG. 2. The second optical waveguide OP2 constitutes, for example, a grating coupler GC having a continuous rib structure. The grating coupler GC is a device that couples an external laser beam to guided light propagating through the second optical waveguide OP2, or extracts a laser beam. Guided light is diffracted and radiated in a specific direction through periodic index modulation (formed by surface roughness) along a propagation direction on an optical waveguide surface. Guided light exponentially attenuates through propagation. Accordingly, the light intensity distribution of diffracted and radiated light also has an exponential distribution.

In the second optical waveguide OP2, a thick part of the silicon layer SI has a height of, for example, about 100 nm to 300 nm, preferably about 200 nm, whereas a thin part of the silicon layer SI has a height of, for example, about 50 nm to 200 nm, preferably about 100 nm.

Furthermore, the Ge photodiode PD, the first optical waveguide OP1, and the second optical waveguide OP2 are covered with a second insulating film IF2, a third insulating film IF3, and a protective film TC. The second insulating film IF2 and the third insulating film IF3 are each made of, for example, silicon oxide. The protective film TC is made of, for example, silicon oxide or silicon oxynitride. The protective film TC may not be formed on the second optical waveguide OP2 for the input and output of an external optical signal.

A wire M1 of the first layer is electrically coupled to a p-type silicon layer PS of the Ge photodiode PD through a first coupling hole CT1 formed on a second insulating film IF2 and a germanium growth protective film GP. Moreover, the wire M1 of the first layer is electrically coupled (not shown) to an n-type germanium layer NG through the first coupling hole CT1 formed on the second insulating film IF2. Furthermore, a wire M2 of the second layer is electrically coupled to the wire M1 of the first layer through a second coupling hole CT2 formed on the third insulating film IF3.

As described above, in the Ge photodiode PD, an i-type germanium IG and an n-type germanium layer NG are embedded in a groove TR formed on the germanium growth protective film GP, the p-type silicon layer PS, and the first insulating film IF1, so that the n-type germanium layer NG and the i-type germanium layer IG do not protrude from the top surface of the germanium growth protective film GP. Thus, the Ge photodiode PD can be easily combined with other optical devices.

<A Method of Manufacturing the Semiconductor Device>

Referring to FIGS. 3 to 9, a method of manufacturing the Ge photodiode will be discussed in steps according to the first embodiment. FIGS. 3 to 9 are cross-sectional views showing the principal part of the Ge photodiode in a manufacturing process according to the first embodiment.

Figure 3:
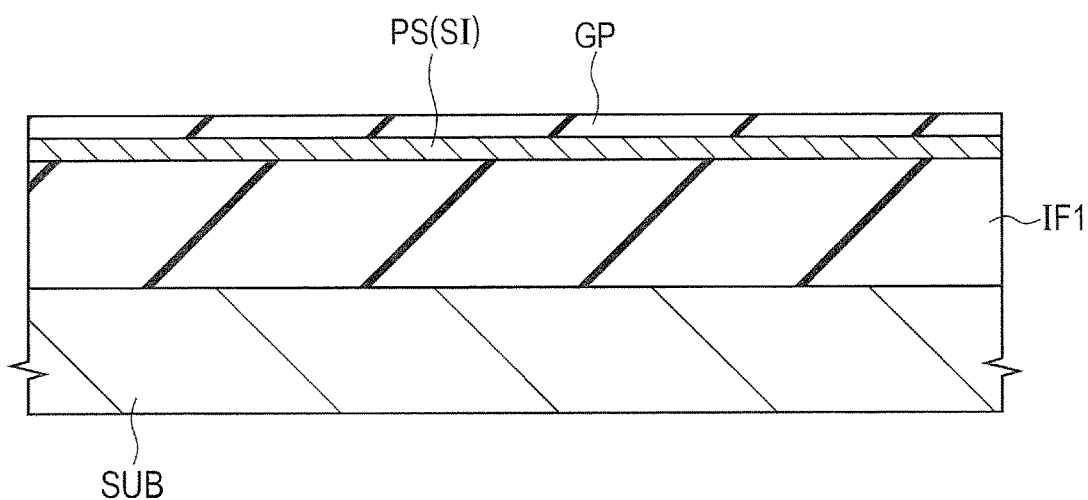
FIG. 3 is a cross-sectional view showing the principal part of the Ge photodiode in a manufacturing process according to the first embodiment.

First, as shown in FIG. 3, a silicon on insulator (SOI) substrate (in this step, a substantially circular flat substrate called a SOI wafer) is prepared which includes the semiconductor substrate SUB, the first insulating film IF1 formed on the major surface of the semiconductor substrate SUB, and the silicon layer (may be called a SOI layer) SI formed on the first insulating film IF1.

The semiconductor substrate SUB is a support substrate made of single crystal silicon. The first insulating film IF1 is made of silicon oxide. The first insulating film IF1 has a thickness of, for example, at least 1 μm, preferably about 1 μm to 3 μm. The silicon layer SI has a thickness of, for example, about 100 nm to 300 nm, preferably about 200 nm. The first insulating film IF1 is relatively thick and thus an electrostatic capacity can be reduced between the semiconductor substrate SUB and the silicon layer SI.

Subsequently, the silicon layer SI is processed into a desired shape by dry etching with a resist pattern serving as a mask, and then the silicon layer SI is doped with a p-type impurity, e.g., boron to form the p-type silicon layer PS.

After that, the germanium growth protective film GP made of, for example, silicon oxide is formed on the first insulating film IF1 so as to cover the p-type silicon layer PS. The germanium growth protective film GP has a thickness of, for example, about 50 nm to 200 nm, preferably about 100 nm.

Figure 4:
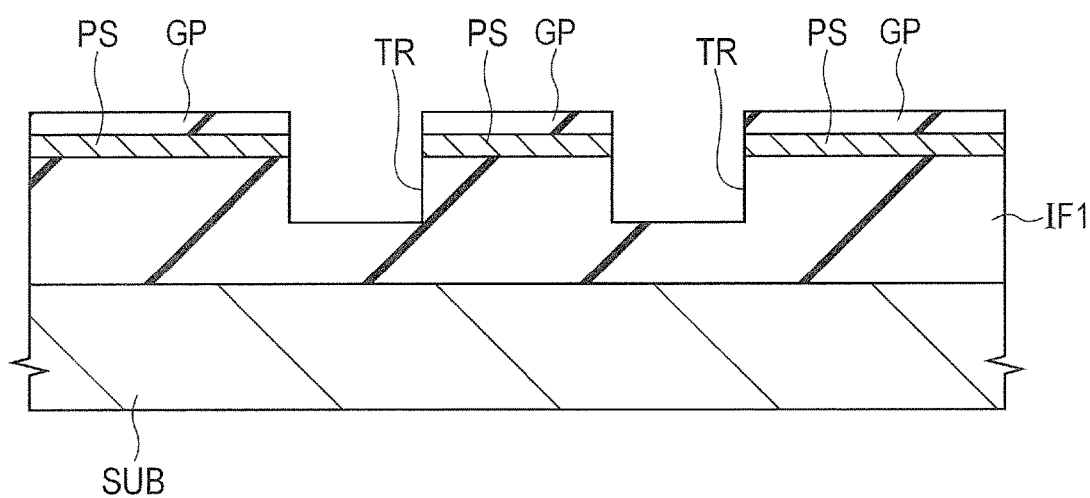
FIG. 4 is a cross-sectional view showing the principal part of the Ge photodiode in the manufacturing process subsequently to FIG. 3.

After that, as shown in FIG. 4, the germanium growth protective film GP, the p-type silicon layer PS, and the first insulating film IF1 are sequentially processed by dry etching with a resist pattern serving as a mask. This forms the groove TR from the top surface of the germanium growth protective film GP without reaching the major surface of the semiconductor substrate SUB. For example, the groove TR is at least 1 μm in depth and is about 30 μm to 50 μm in width. Wet etching may be used instead of dry etching.

Figure 5:
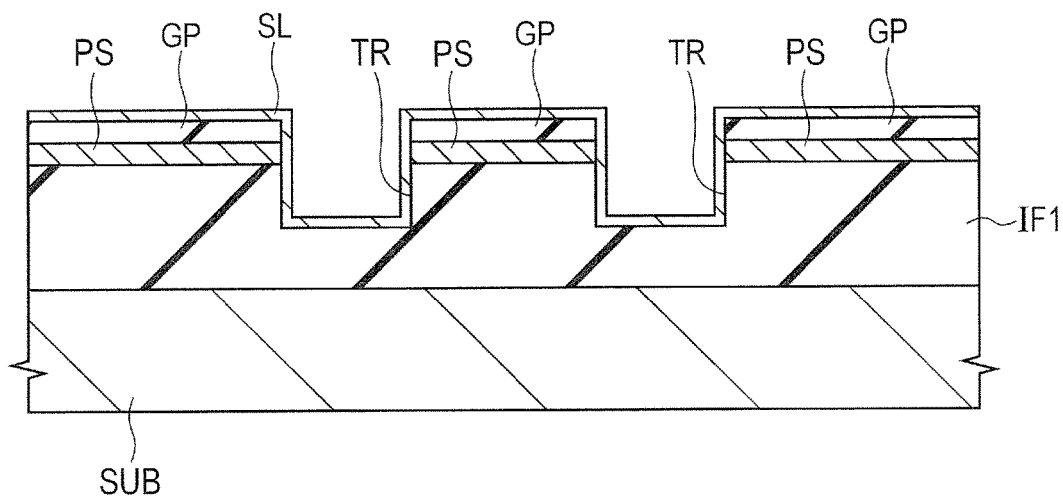
FIG. 5 is a cross-sectional view showing the principal part of the Ge photodiode in the manufacturing process subsequently to FIG. 4.

After that, as shown in FIG. 5, the seed layer SL for germanium growth is formed on the germanium growth protective film GP as well as the inner wall (the bottom and sides) of the groove TR by, for example, low pressure chemical vapor deposition (LPCVD) or plasma chemical vapor deposition (CVD). For example, the seed layer SL is made of amorphous silicon, polysilicon, or silicon germanium and has a thickness of about 10 nm.

In the formation of the seed layer SL made of amorphous silicon, for example, the temperature of the substrate is lower than 500° C. The seed layer SL is formed by epitaxial growth with silane ($SiH_4$) gas. In the formation of the seed layer SL made of polysilicon, for example, the temperature of the substrate is equal to or higher than 500° C. The seed layer SL is formed by epitaxial growth with silane ($SiH_4$) gas.

Figure 6:
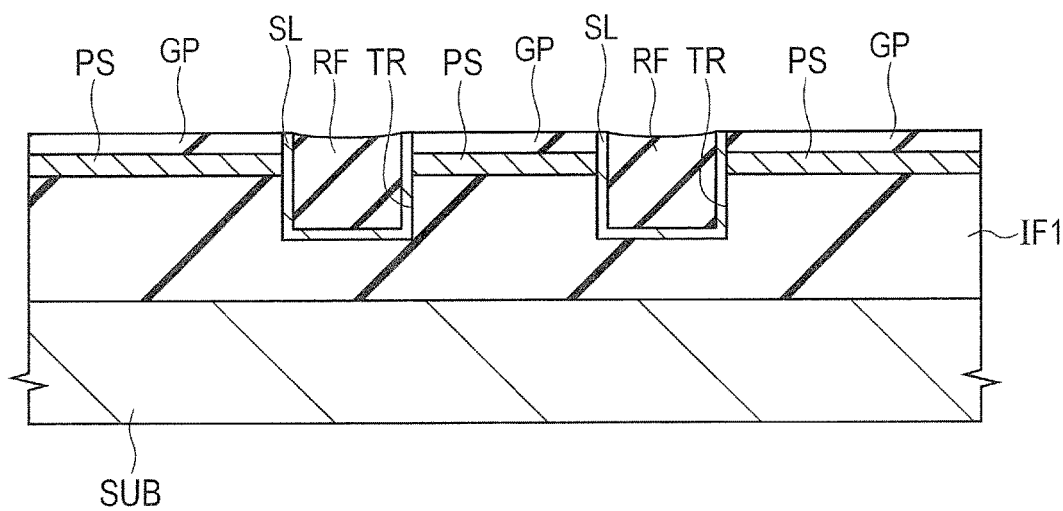
FIG. 6 is a cross-sectional view showing the principal part of the Ge photodiode in the manufacturing process subsequently to FIG. 5.

Subsequently, as shown in FIG. 6, the resist film RF is embedded in the groove TR, and then the seed layer SL exposed on the germanium growth protective film GP is removed by dry etching. After that, the resist film RF is removed. This leaves the seed layer SL only on the inner wall of the groove TR.

Figure 7:
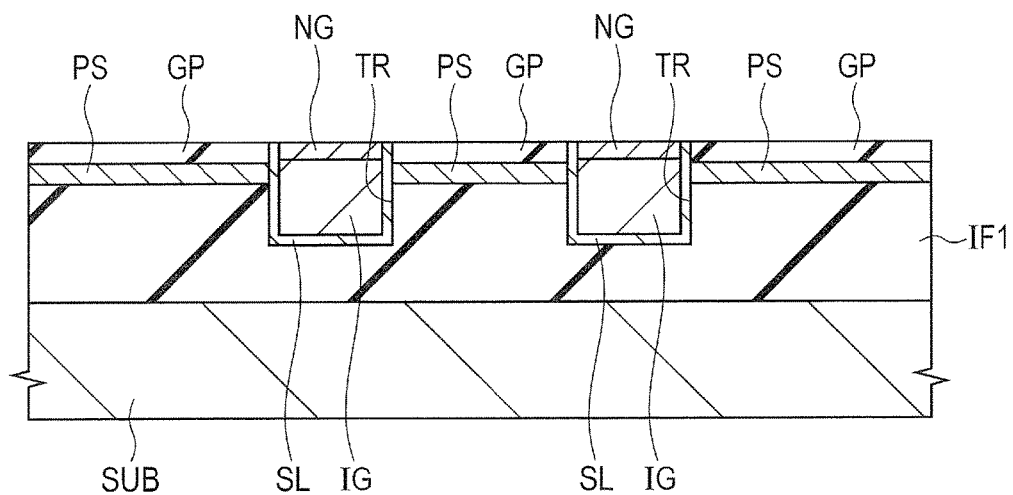
FIG. 7 is a cross-sectional view showing the principal part of the Ge photodiode in the manufacturing process subsequently to FIG. 6.

Subsequently, as shown in FIG. 7, the i-type germanium layer IG is formed in the groove TR by selective epitaxial growth. The i-type germanium layer IG is formed at a substrate temperature of, for example, 600° C. by ultra high vacuum chemical vapor deposition (UHVCVD) with monogermane ($GeH_4$) gas. In order to improve the film quality of the i-type germanium layer IG, the i-type germanium layer IG formed by selective epitaxial growth may be heated at 800° C. or higher.

Since the seed layer SL is formed on the inner wall of the groove TR, the groove TR formed on the first insulating film IF1 is filled with germanium by selective epitaxial growth so as to form the i-type germanium layer IG.

The top surface of the i-type germanium layer IG does not protrude from the top surface of the germanium growth protective film GP, so that the top surface of the i-type germanium layer IG is substantially as high as the top surface of the germanium growth protective film GP.

Subsequently, an n-type impurity, e.g., phosphorus is implanted onto the i-type germanium layer IG by ion implantation to form the n-type germanium layer NG on the i-type germanium layer IG. The n-type germanium layer NG may be replaced with an n-type silicon germanium layer or an n-type silicon layer.

The process forms the pin structure that includes the i-type germanium layer IG provided in the groove TR, the n-type germanium layer NG provided on the i-type germanium layer IG in the groove TR, and the p-type silicon layer PS partially exposed on both sides of the groove TR.

Figure 8:
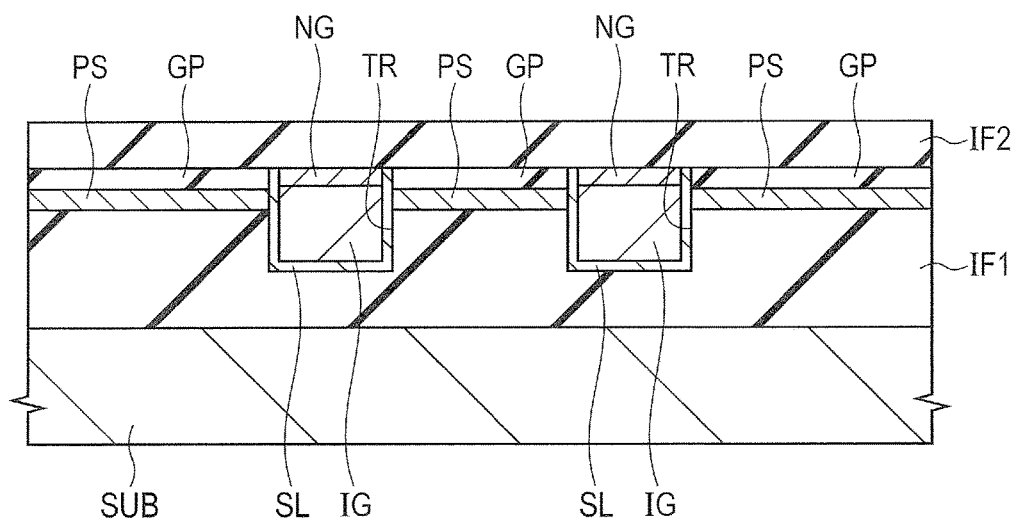
FIG. 8 is a cross-sectional view showing the principal part of the Ge photodiode in the manufacturing process subsequently to FIG. 7.

Subsequently, as shown in FIG. 8, the second insulating film IF2 is formed on the n-type germanium layer NG provided in the groove TR and the germanium growth protective film GP. For example, the second insulating film IF2 is made of silicon oxide and has a thickness of about 0.5 μm to 2 μm. Since the top surface of the n-type germanium layer NG is substantially as high as the top surface of the germanium growth protective film GP, the second insulating film IF2 is flat with a substantially even thickness.

Figure 9:
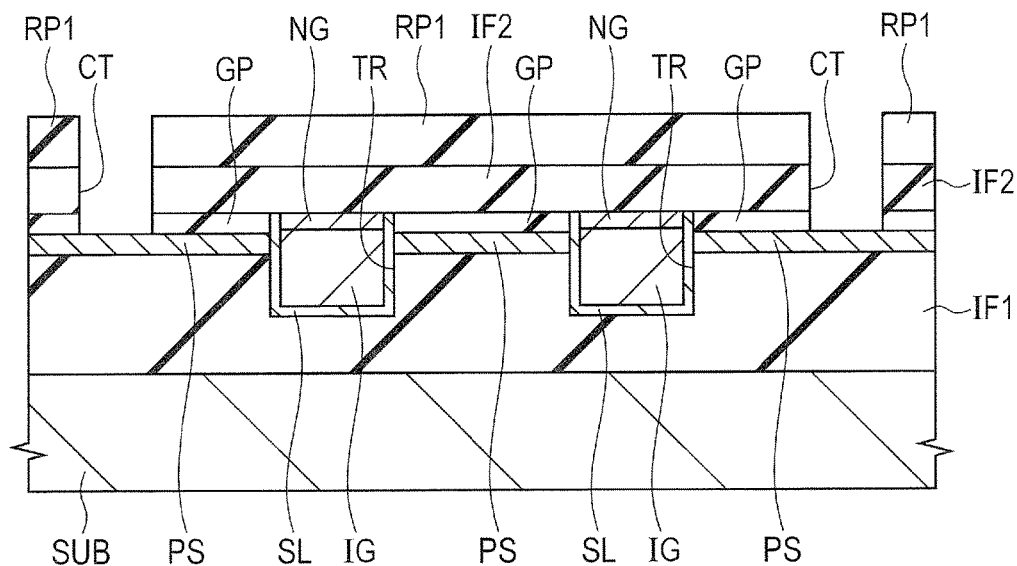
FIG. 9 is a cross-sectional view showing the principal part of the Ge photodiode in the manufacturing process subsequently to FIG. 8.

After that, as shown in FIG. 9, the second insulating film IF2 and the germanium growth protective film GP on the p-type silicon layer PS are sequentially processed by dry etching with the resist pattern RP1 serving as a mask. This forms the coupling hole CT that reaches the p-type silicon layer PS. The coupling hole CT has a width of, for example, about 100 nm to 200 nm. At this point, the second insulating film IF2 on the n-type germanium layer NG is processed to form a coupling hole CT (not shown) that reaches the n-type germanium layer NG.

As described above, the i-type germanium IG and the n-type germanium layer NG are embedded in the groove TR formed on the germanium growth protective film GP, the p-type silicon layer PS, and the first insulating film IF1, so that the n-type germanium layer NG and the i-type germanium layer IG do not protrude from the top surface of the germanium growth protective film GP.

Thus, the second insulating film IF2 covering the p-type silicon layer PS, the i-type germanium layer IG, and the n-type germanium layer NG has a substantially even thickness and a substantially flat top surface. This can prevent a fault in the formation of the coupling hole CT on the second insulating film IF2. For example, this configuration does not have a step unlike in FIG. 17 and thus prevents problems such as defocusing in lithography, an insufficiently remaining resist pattern film, and variations in over-etching amount. This can avoid a defective opening of the coupling hole CT or a cut of the second insulating film IF2 on the n-type germanium layer NG.

Figure 10:
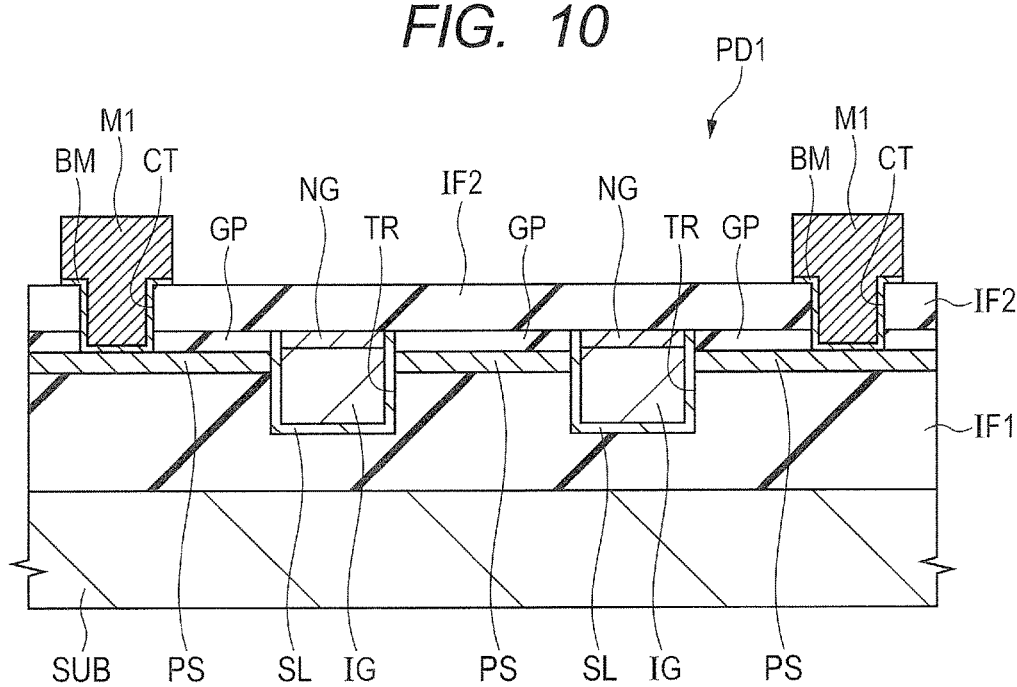
FIG. 10 is a cross-sectional view showing the principal part of the Ge photodiode in the manufacturing process subsequently to FIG. 9.

After that, as shown in FIG. 10, the resist pattern RP1 is removed and then the barrier metal film BM is formed on the second insulating film IF2 as well as the inner wall (the bottom and sides) of the coupling hole CT by, for example, sputtering. The barrier metal film BM includes, for example, a titanium film, a tantalum film, a titanium nitride film, or a tantalum nitride film. Alternatively, the barrier metal film BM includes, for example, a Ti/Ta laminated film with a titanium film serving as a lower layer and a tantalum film serving as an upper layer, a Ta/Ti laminated film with a tantalum film serving as a lower layer and a titanium film serving as an upper layer, a Ti/TiN laminated film with a titanium film serving as a lower layer and a tantalum nitride film serving as an upper layer, or a Ta/TaN laminated film with a tantalum film serving as a lower layer and a tantalum nitride film serving as an upper layer. The barrier metal film BM has a thickness of, for example, about 50 nm to 100 nm.

Subsequently, a metal film, e.g., an aluminum film or a copper film is formed on the barrier metal film BM and then is processed by dry etching to form the wire M1 of the first layer with a resist pattern serving as a mask.

After that, an upper wire is further formed to substantially complete the Ge photodiode PD1 having the pin structure including the p-type silicon layer PS, the i-type germanium layer IG, and the n-type germanium layer NG.

<Modification of the Method of Manufacturing the Semiconductor Device>

Figure 11:
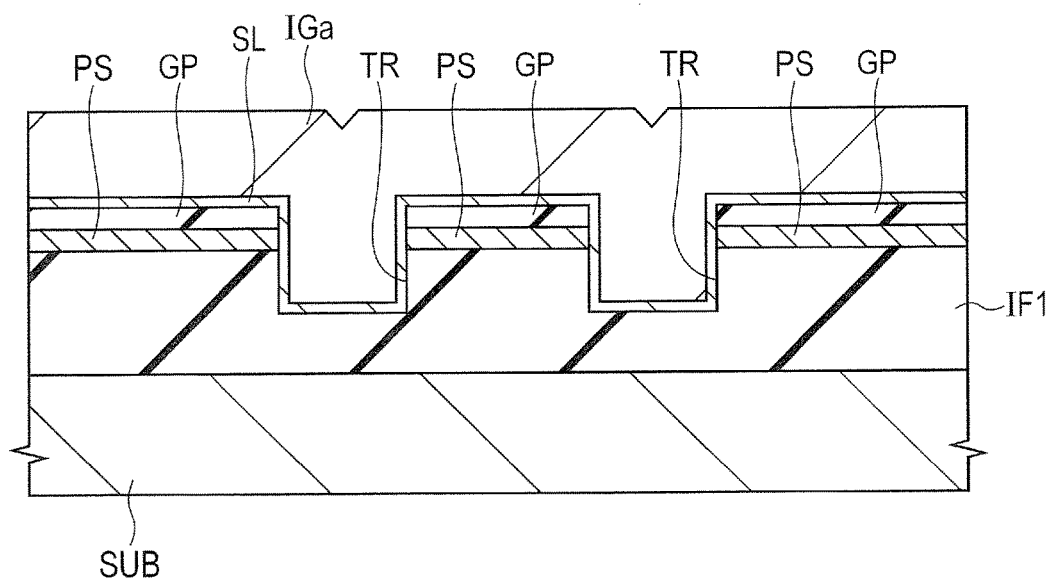
FIG. 11 is a cross-sectional view showing the principal part of a Ge photodiode in a manufacturing process according to a modification of the first embodiment.
Figure 12:
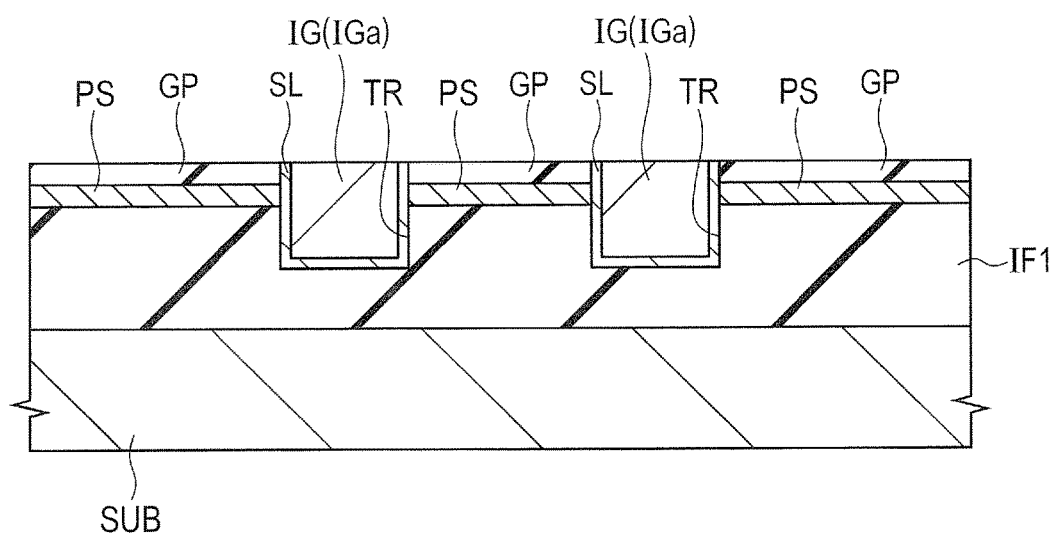
FIG. 12 is a cross-sectional view showing the principal part of the Ge photodiode in the manufacturing process subsequently to FIG. 11.

Referring to FIGS. 11 and 12, a method of manufacturing a Ge photodiode will be discussed in steps according to a modification of the first embodiment. FIGS. 11 and 12 are cross-sectional views showing the principal part of the Ge photodiode in a manufacturing process according to the modification of the first embodiment.

First, as in the foregoing method of manufacturing the Ge photodiode, a seed layer SL for germanium growth is formed, as shown in FIG. 6, on a germanium growth protective film GP as well as on the inner wall (the bottom and sides) of a groove TR.

As shown in FIG. 11, a germanium layer IGa is then formed on the seed layer SL at a substrate temperature of, for example, 600° C. by epitaxial growth with monogermane (GeH$_4$) gas. At this point, the groove TR is filled with the germanium layer IGa. The germanium layer IGa is formed with the top surface higher than that of the seed layer SL.

After that, as shown in FIG. 12, the top surface of the germanium layer IGa is polished by, for example, chemical mechanical polishing (CMP) so as to remain only in the groove TR. Moreover, the seed layer SL exposed on the germanium growth protective film GP is removed. This forms the i-type germanium layer IG in the groove TR with the seed layer SL interposed between the i-type germanium layer IG and the groove TR.

According to the first embodiment, in the Ge photodiode PD1, the i-type germanium IG and the n-type germanium layer NG are embedded in the groove TR formed on the first insulating film IF1, the p-type silicon layer PS, and the germanium growth protective film GP. The n-type germanium layer NG and the i-type germanium layer IG do not protrude from the top surface of the germanium growth protective film GP.

Thus, the i-type germanium layer IG can have a thickness of at least 1 μm regardless of the thickness of the p-type silicon layer PS, achieving proper photodiode characteristics in the Ge photodiode PD1. Thus, the Ge photodiode PD1 can be easily combined with other optical devices.

Furthermore, the second insulating film IF2 covering the p-type silicon layer PS, the i-type germanium layer IG, and the n-type germanium layer NG has a substantially even thickness with a substantially flat top surface, thereby eliminating defects in the formation of the coupling hole CT on the second insulating film IF2. For example, this configuration can avoid a defective opening of the coupling hole CT or a cut of the second insulating film IF2 on the n-type germanium layer NG, achieving proper photodiode characteristics in the Ge photodiode PD1.

Second Embodiment

<The Structure of a Semiconductor Device>

Figure 13:
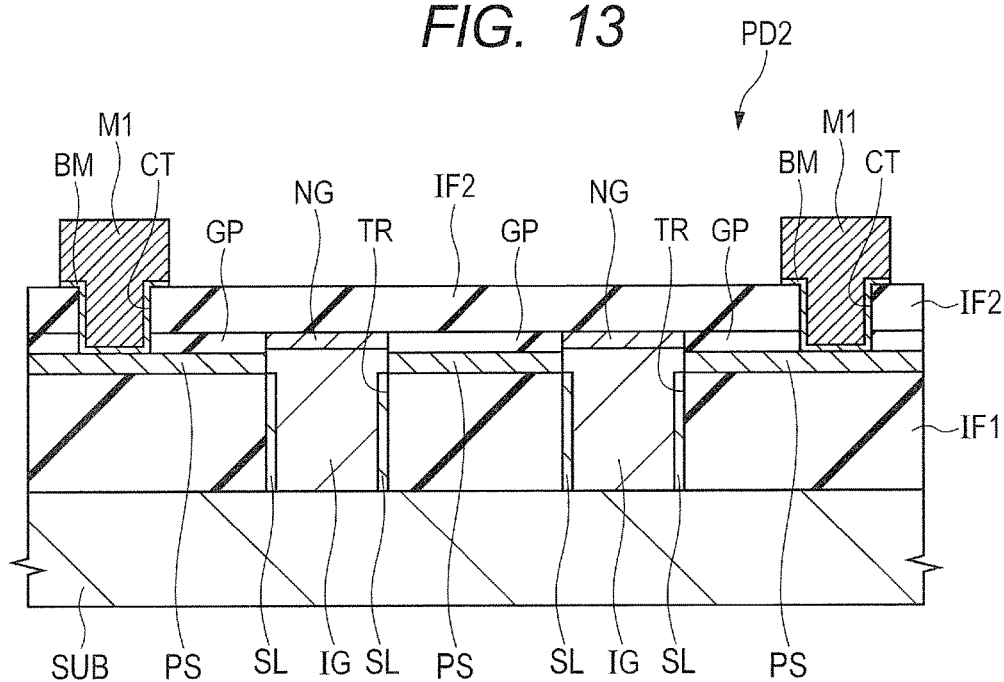
FIG. 13 is a cross-sectional view showing the principal part of a Ge photodiode according to a second embodiment.

Referring to FIG. 13, the structure of a Ge photodiode according to a second embodiment will be described below. FIG. 13 is a cross-sectional view showing the principal part of the Ge photodiode according to the second embodiment.

As shown in FIG. 13, a Ge photodiode PD2 according to the second embodiment is different from the Ge photodiode PD1 of the first embodiment mainly in that a semiconductor substrate SUB exposed at the bottom of a groove TR is used as a seed layer.

Specifically, in the Ge photodiode PD1 of the first embodiment, the groove TR is formed on the germanium growth protective film GP, the p-type silicon layer PS, and the first insulating film IF1 without reaching the major surface of the semiconductor substrate SUB. Moreover, the i-type germanium layer IG is provided in the groove TR with the seed layer SL interposed between the i-type germanium layer IG and the groove TR. The seed layer SL made of, for example, amorphous silicon or polysilicon is formed on the inner wall (the bottom and sides) of the groove TR.

In the Ge photodiode PD2 of the second embodiment, the groove TR is formed on a germanium growth protective film GP, a p-type silicon layer PS, and a first insulating film IF1 so as to reach the semiconductor substrate SUB made of single crystal silicon, and a seed layer SL made of, for example, amorphous silicon or polysilicon is formed only on the sides of the groove TR. Moreover, an i-type germanium layer IG is provided in the groove TR so as to be exposed at the bottom of the groove TR with the seed layer SL interposed between the side of the groove TR and the i-type germanium layer IG.

In the Ge photodiode PD2, the thickness of the i-type germanium layer IG is determined according to the thickness of the first insulating film IF1, thereby improving control on the thickness of the i-type germanium layer IG. As will be discussed in a method of manufacturing the semiconductor device, the i-type germanium layer IG is formed by selective epitaxial growth directly on the major surface of the semiconductor substrate SUB made of single crystal silicon, achieving excellent crystallinity.

<The Method of Manufacturing the Semiconductor Device>

Figure 14:
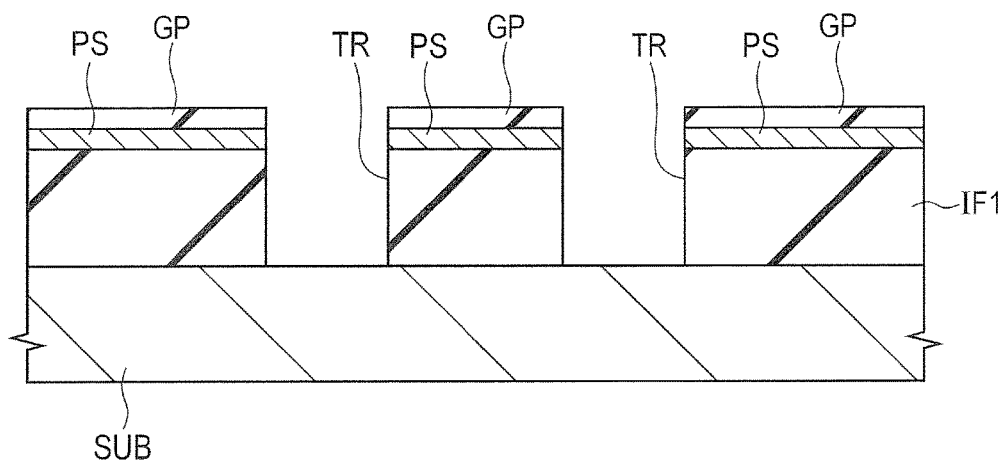
FIG. 14 is a cross-sectional view showing the principal part of the Ge photodiode in a manufacturing process according to the second embodiment.
Figure 15:
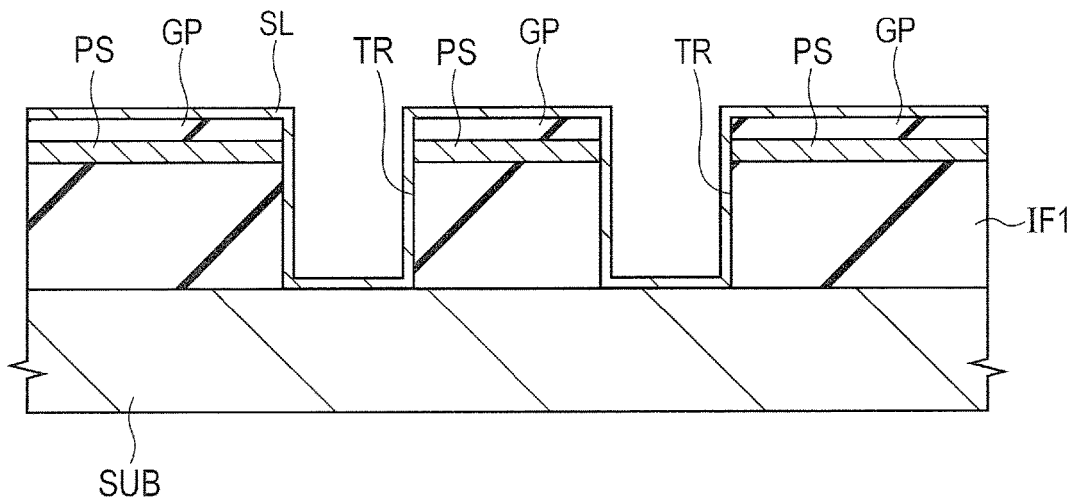
FIG. 15 is a cross-sectional view showing the principal part of the Ge photodiode in the manufacturing process subsequently to FIG. 14.
Figure 16:
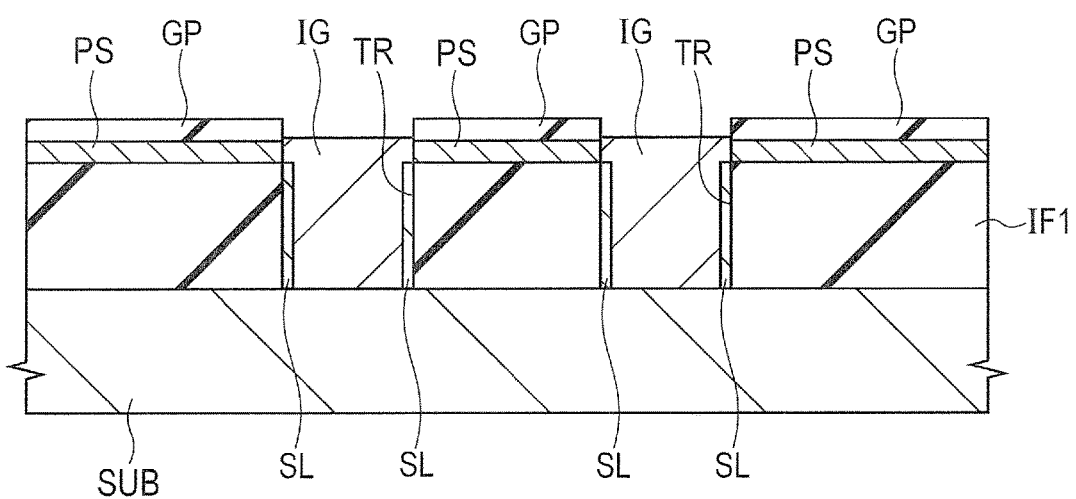
FIG. 16 is a cross-sectional view showing the principal part of the Ge photodiode in the manufacturing process subsequently to FIG. 15.

Referring to FIGS. 14 to 16, the method of manufacturing the Ge photodiode will be discussed in steps according to the second embodiment. FIGS. 14 to 16 are cross-sectional views showing the principal part of the Ge photodiode in a manufacturing process according to the second embodiment.

First, as in the first embodiment, a SOI substrate is prepared and then the germanium growth protective film GP is formed over the p-type silicon layer PS.

Subsequently, as shown in FIG. 14, the germanium growth protective film GP, the p-type silicon layer PS, and the first insulating film IF1 are sequentially processed by dry etching with a resist pattern serving as a mask. This forms the groove TR from the top surface of the germanium growth protective film GP without reaching the semiconductor substrate SUB. The semiconductor substrate SUB is exposed at the bottom of the groove TR. Wet etching may be used instead of dry etching.

After that, as shown in FIG. 15, the seed layer SL for germanium growth is formed on the germanium growth protective film GP as well as the inner wall (the bottom and sides) of the groove TR by, for example, LPCVD or plasma CVD. For example, the seed layer SL is made of amorphous silicon, polysilicon, or silicon germanium and has a thickness of about 10 nm.

As shown in FIG. 16, the seed layer SL is then processed by etch back so as to be removed from the bottom of the groove TR and the top surface of the germanium growth protective film GP. This leaves the seed layer SL only on the sides of the groove TR. During the etch back, an overetching amount may be increased so as to expose the p-type silicon layer PS on the sides of the groove TR. Thus, the p-type silicon layer PS exposed on the sides of the groove TR can be used as a seed layer for germanium growth.

After that, the i-type germanium layer IG is formed in the groove TR by selective epitaxial growth. The i-type germanium layer IG is formed at a substrate temperature of, for example, 600° C. by UHVCVD with monogermane (GeH$_4$) gas. In order to improve the film quality of the i-type germanium layer IG, the i-type germanium layer IG formed by selective epitaxial growth may be heated at 800° C. or higher.

Since the seed layer SL is formed on the sides of the groove TR, the groove TR formed on the first insulating film IF1 is filled with germanium by selective epitaxial growth so as to form the i-type germanium layer IG. Moreover, the semiconductor substrate SUB made of single crystal silicon having excellent crystallinity is exposed at the bottom of the groove TR. The semiconductor substrate SUB can be used as a seed layer for germanium growth and thus the i-type germanium layer IG having excellent crystallinity can be formed by selective epitaxial growth. If the p-type silicon layer PS is exposed on the sides of the groove TR, the p-type silicon layer PS can be also used as a seed layer for germanium growth, thereby forming the i-type germanium layer IG having excellent crystallinity by selective epitaxial growth.

After that, as in the first embodiment, an n-type germanium layer NG is formed on the i-type germanium layer IG. This forms a pin structure including the i-type germanium layer IG provided in the groove TR, the n-type germanium layer NG provided in the groove TR and on the i-type germanium layer IG, and the p-type silicon layer PS partially exposed on both sides of the groove TR.

As described above, according to the second embodiment, when the i-type germanium layer IG is formed in the groove TR by selective epitaxial growth, the seed layer for germanium growth may be the semiconductor substrate SUB exposed at the bottom of the groove TR, that is, silicon having excellent crystallinity. Thus, the crystallinity of the i-type germanium layer IG can be improved as compared with the first embodiment.

The invention made by the present inventors was specifically described according to the foregoing embodiments. Obviously, the present invention is not limited to the embodiments and can be changed in various ways without departing from the scope of the invention.

For example, in the foregoing embodiments, the pin structure of the Ge photodiode includes the p-type silicon layer, the i-type germanium layer, and the n-type germanium layer. The present invention is not limited to this configuration. For example, the Ge photodiode may have a pn structure including a p-type silicon layer and an n-type germanium layer.

The present invention includes at least the following embodiments:

APPENDIX 1

A method of manufacturing a semiconductor device, including the steps of:
(a) preparing a SOI substrate including a semiconductor substrate, a first insulating film formed on the major surface of the semiconductor substrate, and a silicon layer of a first conductivity type on the first insulating film;
(b) forming a protective film on the silicon layer;
(c) processing the protective film, the silicon layer, and the first insulating film in sequence so as to form a groove from the top surface of the protective film without reaching the major surface of the semiconductor substrate;
(d) forming a seed layer on the protective film as well as the bottom and sides of the groove;
(e) forming a germanium layer on the seed layer by epitaxial growth;
(f) polishing the top surface of the germanium layer so as to leave the germanium layer only in the groove;
(g) removing the seed layer on the protective film; and
(h) forming a second insulating film on the germanium layer and the protective film.

APPENDIX 2

In the method of manufacturing the semiconductor device according to appendix 1, the groove has a depth of at least 1 μm from the top surface of the protective film.

APPENDIX 3

In the method of manufacturing the semiconductor device according to appendix 1, the seed layer is an amorphous silicon film or a polysilicon film that is formed by LPCVD or plasma CVD.

APPENDIX 4

The method of manufacturing the semiconductor device according to appendix 1 further includes the step of (i) ion-implanting an impurity of a second conductivity type different from the first conductivity type on the germanium layer between the steps (f) and (h).

APPENDIX 5

The method of manufacturing the semiconductor device according to appendix 1 further includes the step of (j) heating the germanium layer at 800° C. or higher after the step (f).

APPENDIX 6

A method of manufacturing a semiconductor device, including the steps of:
(a) preparing a SOI substrate including a semiconductor substrate, a first insulating film formed on the major surface of the semiconductor substrate, and a silicon layer of a first conductivity type on the first insulating film;
(b) forming a protective film on the silicon layer;
(c) processing the protective film, the silicon layer, and the first insulating film in sequence so as to form a groove from the top surface of the protective film so as to reach the major surface of the semiconductor substrate;
(d) forming a seed layer on the protective film as well as the bottom and sides of the groove;
(e) removing the seed layer on the protective film and the bottom of the groove so as to leave the seed layer on the sides of the groove;
(f) forming a germanium layer in the groove by epitaxial growth; and
(g) forming a second insulating film on the germanium layer and the protective film.

APPENDIX 7

In the method of manufacturing the semiconductor device according to appendix 6, the groove has a depth of at least 1 μm from the top surface of the protective film.

APPENDIX 8

In the method of manufacturing the semiconductor device according to appendix 6, the seed layer is an amorphous silicon film or a polysilicon film that is formed by LPCVD or plasma CVD.

APPENDIX 9

The method of manufacturing the semiconductor device according to appendix 6 further includes the step of (h) ion-implanting an impurity of a second conductivity type different from the first conductivity type on the germanium layer between the steps (f) and (g).

APPENDIX 10

In the method of manufacturing the semiconductor device according to appendix 6, in the step (e), the seed layer on the sides of the groove is processed to expose the protective film and the silicon layer on the sides of the groove.

APPENDIX 11

The method of manufacturing the semiconductor device according to appendix 6 further includes the step of (i) heating the germanium layer at 800° C. or higher after the step (f).

What is claimed is:

1. A semiconductor device comprising:
   a semiconductor substrate;
   a first insulating film formed over an upper surface of the semiconductor substrate;
   a silicon layer formed over the first insulating film;
   a protective film formed over the silicon layer;
   a groove formed in the protective film, the silicon layer, and the first insulating film starting from a top surface of the protective film and without reaching the upper surface of the semiconductor substrate;
   a seed layer formed over inner bottom and side surfaces of the groove;
   a germanium layer embedded in the groove with the seed layer interposed between the germanium layer and the bottom and side surfaces of the groove; and
   a second insulating film formed over the germanium layer and the protective film.

2. The semiconductor device according to claim 1, wherein the groove has a depth of at least 1 μm from the top surface of the protective film.

3. The semiconductor device according to claim 1, wherein the seed layer is made of amorphous silicon, polysilicon, or silicon germanium.

4. The semiconductor device according to claim 1, wherein the silicon layer includes a p-type semiconductor, and the germanium layer has an underside of an intrinsic semiconductor and a top surface of an n-type semiconductor, and
   wherein the semiconductor device has a pin structure including the silicon layer, the underside of the germanium layer, and the top surface of the germanium layer.

5. A semiconductor device comprising:
   a semiconductor substrate;
   a first insulating film formed over an upper surface of the semiconductor substrate;
   a silicon layer formed over the first insulating film;
   a protective film formed over the silicon layer;
   a groove formed in the protective film, the silicon layer, and the first insulating film starting from a top surface of the protective film and so as to reach the upper surface of the semiconductor substrate;
   a seed layer formed over portions of inner side surfaces of the groove;
   a germanium layer embedded in the groove; and
   a second insulating film formed over the germanium layer and the protective film,
   wherein the germanium layer is in contact with the upper surface of the semiconductor substrate exposed at a bottom of the groove and is in contact with the seed layer.

6. The semiconductor device according to claim 5, wherein the groove has a depth of at least 1 μm from the top surface of the protective film.

7. The semiconductor device according to claim 5, wherein the seed layer is made of amorphous silicon, polysilicon, or silicon germanium.

8. The semiconductor device according to claim 5, wherein, in portions of the side surfaces of the groove where the seed layer is not formed, the silicon layer is exposed, and the germanium layer is in contact with the exposed silicon layer.

9. The semiconductor device according to claim 5, wherein the silicon layer includes a p-type semiconductor, and the germanium layer has an underside of an intrinsic semiconductor and a top surface of an n-type semiconductor, and
   wherein the semiconductor device has a pin structure including the silicon layer, the underside of the germanium layer, and the top surface of the germanium layer.

10. A method of manufacturing a semiconductor device, comprising the steps of:
    (a) preparing a SOI substrate including a semiconductor substrate, a first insulating film formed over an upper surface of the semiconductor substrate, and a silicon layer of a first conductivity type over the first insulating film;
    (b) forming a protective film over the silicon layer;
    (c) processing the protective film, the silicon layer, and the first insulating film in sequence so as to form a groove in the protective film, the silicon layer, and the first insulating film, starting from a top surface of the protective film and without reaching the upper surface of the semiconductor substrate;
    (d) forming a seed layer over the protective film and inner a bottom and side surfaces of the groove;
    (e) removing the seed layer formed over the protective film so as to leave the seed layer formed over the bottom and side surfaces of the groove;
    (f) forming a germanium layer in the groove by epitaxial growth; and
    (g) forming a second insulating film over the germanium layer and the protective film.

11. The method of manufacturing a semiconductor device according to claim 10,
    wherein the groove has a depth of at least 1 μm from the top surface of the protective film.

12. The method of manufacturing a semiconductor device according to claim 10,
    wherein the seed layer is an amorphous silicon film or a polysilicon film that is formed by LPCVD or plasma CVD.

13. The method of manufacturing a semiconductor device according to claim 10, further comprising the step of:
    (h) ion-implanting an impurity of a second conductivity type different from the first conductivity type over the germanium layer between the steps (f) and (g).

14. The method of manufacturing a semiconductor device according to claim 10, further comprising the step of:
    (i) heating the germanium layer at 800° C. or higher after the step (f).

15. The method of manufacturing a semiconductor device according to claim 10, further comprising, after the step (g), the steps of:
- (j) forming a first coupling hole in the second insulating film and the protective film so as to reach the silicon layer, and forming a second coupling hole in the second insulating film so as to reach the germanium layer; and
- (k) forming a first wire electrically coupled to the silicon layer through the first coupling hole and a second wire electrically coupled to the germanium layer through the second coupling hole.

* * * * *